United States Patent
Tan et al.

(10) Patent No.: US 8,084,299 B2
(45) Date of Patent: Dec. 27, 2011

(54) SEMICONDUCTOR DEVICE PACKAGE AND METHOD OF MAKING A SEMICONDUCTOR DEVICE PACKAGE

(75) Inventors: Chip King Tan, Perak (MY); Boon Huan Gooi, Penang (MY)

(73) Assignee: Infineon Technologies AG, Neubiberg (DE)

( * ) Notice: Subject to any disclaimer, the term of this patent is extended or adjusted under 35 U.S.C. 154(b) by 247 days.

(21) Appl. No.: 12/024,634

(22) Filed: Feb. 1, 2008

(65) Prior Publication Data
US 2009/0194854 A1    Aug. 6, 2009

(51) Int. Cl.
*H01L 21/00* (2006.01)

(52) U.S. Cl. . 438/111; 438/123; 257/666; 257/E23.031; 257/E23.043

(58) Field of Classification Search ............... 438/111; 257/E23.031, E23.043
See application file for complete search history.

(56) References Cited

U.S. PATENT DOCUMENTS

| | | |
|---|---|---|
| 5,184,208 A | 2/1993 | Sakuta et al. |
| 5,214,846 A | 6/1993 | Asami et al. |
| 5,313,102 A | 5/1994 | Lim et al. |
| 5,357,139 A | 10/1994 | Yaguchi et al. |
| 5,373,188 A | 12/1994 | Michii et al. |
| 5,428,247 A | 6/1995 | Sohn et al. |
| 5,863,805 A | 1/1999 | Chiang |
| 6,069,029 A | 5/2000 | Murakami et al. |
| 6,211,573 B1 | 4/2001 | Ichinose |
| 6,420,779 B1 | 7/2002 | Sharma et al. |
| 6,451,627 B1 | 9/2002 | Coffman |
| 6,482,680 B1 | 11/2002 | Khor et al. |
| 6,661,087 B2 | 12/2003 | Wu |
| 6,812,552 B2 | 11/2004 | Islam et al. |
| 6,933,594 B2 | 8/2005 | McLellan et al. |
| 6,975,022 B2 * | 12/2005 | Sakamoto et al. ............ 257/676 |
| 7,186,588 B1 * | 3/2007 | Bayan et al. .................. 438/112 |
| 2004/0063252 A1* | 4/2004 | Takahashi ..................... 438/123 |
| 2007/0126092 A1* | 6/2007 | San Antonio et al. ........ 257/674 |

FOREIGN PATENT DOCUMENTS
| | | |
|---|---|---|
| DE | 10147375 B4 | 6/2006 |
| DE | 10132385 B4 | 7/2006 |

\* cited by examiner

*Primary Examiner* — Ha Tran T Nguyen
*Assistant Examiner* — Shaka Scarlett
(74) *Attorney, Agent, or Firm* — Dicke, Billig & Czaja, PLLC

(57) ABSTRACT

A method of manufacturing an electronic device is provided. The method comprises providing a carrier sheet, etching the lead frame material sheet to form a recess on a first surface of the lead frame material sheet, placing an electronic chip into the recess of the carrier sheet, and thereafter, selectively etching a second surface of the lead frame material sheet, the second surface being opposite to the first surface.

16 Claims, 7 Drawing Sheets

SEMICONDUCTOR DEVICE PACKAGE AND METHOD OF MAKING A SEMICONDUCTOR DEVICE PACKAGE

FIELD OF TECHNOLOGY

The present application relates to a semiconductor package, in our embodiment a Chip-On-Lead (COL) package. It also relates to a method of making a semiconductor package.

BACKGROUND

Conventional packaged semiconductor devices have been produced by bonding a semiconductor element to a die pad of a lead frame with an adhesive such as a silver paste. The lead frame is connected to the semiconductor element by bond wires. A whole body of the semiconductor device except for outer leads is sealed. The outer leads are for external connection.

A recent demand for packaged semiconductor devices of higher density, smaller area and thickness has lead to development of new packages with various structures. The new packages can be used for handheld portable electronic devices, which require small size, lightweight, along with excellent thermal and electrical performance.

An example of the new package is a COL (Chip on Lead) package, which includes a die that is mounted directly on a lead frame. The COL is also known as LOC (Lead on Chip).

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following description, details are provided to describe the embodiments of the application. It shall be apparent to one skilled in the art, however, that the embodiments may be practiced without such details.

Figure 1:
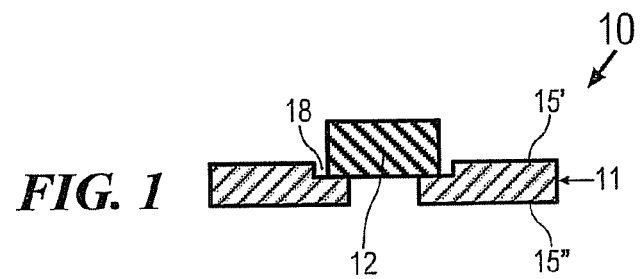
FIG. 1 illustrates one embodiment of a semiconductor package including a sectioned view of a first encapsulated COL package.

FIG. 1 illustrates one embodiment of a sectioned view of a semiconductor device package including a first encapsulated COL package 10. The first encapsulated COL package 10 includes a plurality of lead fingers 11 and a semiconductor chip 12.

The lead fingers 11 have recesses 18 placed at the ends of the lead fingers 11. The recess 18 is also known as a recessed portion. The semiconductor chip 12 is placed on a recess of the lead fingers 11. The individual lead finger 11 is separated from its adjacent lead finger 11.

The recess 18 is configured to receive the semiconductor chip 12. The recess 18 enable the semiconductor chip 12 to be placed at a lower height. This allows the COL package 10 to be thinner. Moreover, the recess 18 helps to keep the semiconductor chip 12 from shifting and to retain its position.

The lead fingers 11 act as electrical contacts or electrical terminals between electrical circuits of the semiconductor chip 12 and external circuitry. The semiconductor chip 12 has electrical circuits which receive electrical signals from the external circuitry, process the electrical signals and transmits the processed signals to the external circuitry.

In a generic sense, the lead finger 11 is the form of an electrical connection element. The electrical connection element may include an electrical terminal. The lead finger 11 is also known as leads. In one embodiment, the semiconductor chip 12 is an electronic component. The semiconductor chip 12 may includes digital or analog circuitry. The electronic component may include discrete electrical components such as resistors.

Figure 2:
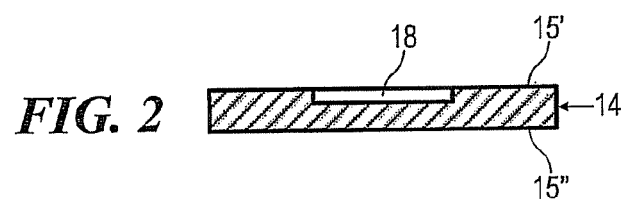
FIG. 2 illustrates a lead frame material for making the package of FIG. 1.

A method of producing the first encapsulated COL package 10 is illustrated in FIGS. 2 to 5. A lead frame material sheet 14 is provided, as illustrated in FIG. 2. The lead frame material sheet 14 has a first surface 15' and a second surface 15" that is opposite to the first surface 15'.

The first surface 15' has a continuous surface area. The continuous surface area has no through hole, gap, or opening on its surface. Despite this, the continuous surface area can have a cavity. In other words, the continuous surface area is uninterrupted.

Figure 3:
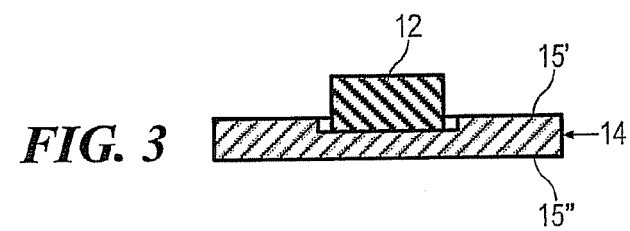
FIG. 3 illustrates the lead frame material of FIG. 2 with a die.
Figure 4:
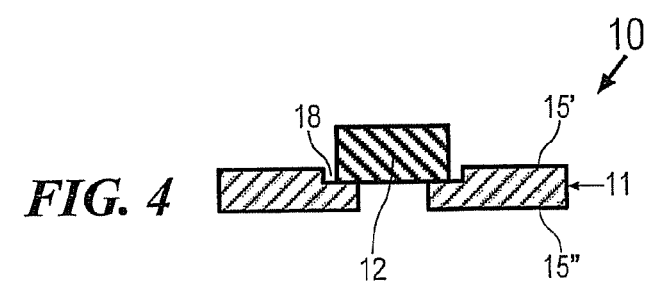
FIG. 4 illustrates the lead frame material of FIG. 3 with an etched bottom surface.

The continuous surface area of the first surface 15' is then etched to form the recess 18, as illustrated in FIG. 2. After this, the semiconductor chip 12 is placed in the recess 18 of the first surface 15'. This is depicted in FIG. 3.

Figure 5:
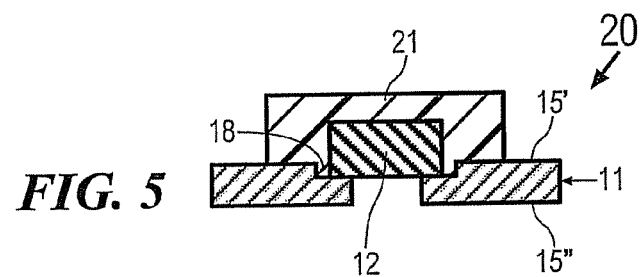
FIG. 5 illustrates a sectioned view of a second encapsulated COL package.

After this, the second surface 15" of lead frame material sheet 14 is etched. The etching forms opening spaces on the lead frame material sheet 14 such that a portion of the base on the recess 18 is removed, the base being portion of the lead frame material sheet that is underneath the semiconductor chip 12. The opening space connects the first surface 15' to the second surface 15". In other words, the lead frame material sheet 14 is separated to form individual lead fingers 11, as illustrated in FIG. 5. The separating of lead frame material sheet 14 is also known as fragmenting the lead frame material sheet 14.

In a broad sense, the lead frame material 14 is a form of a carrier sheet. The carrier sheet is intended for forming electrical connection elements or lead fingers. The process of etching is a form of removing.

Figure 6:
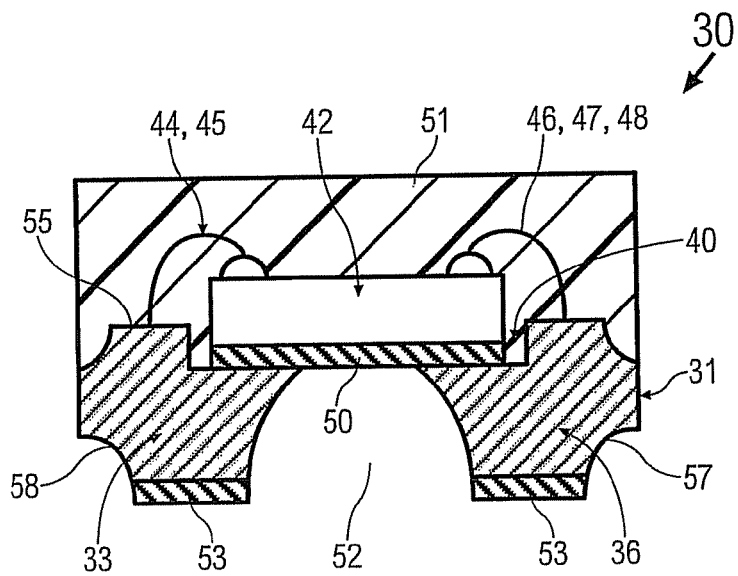
FIG. 6 illustrates a sectioned front view of a third encapsulated COL package.
Figure 7:
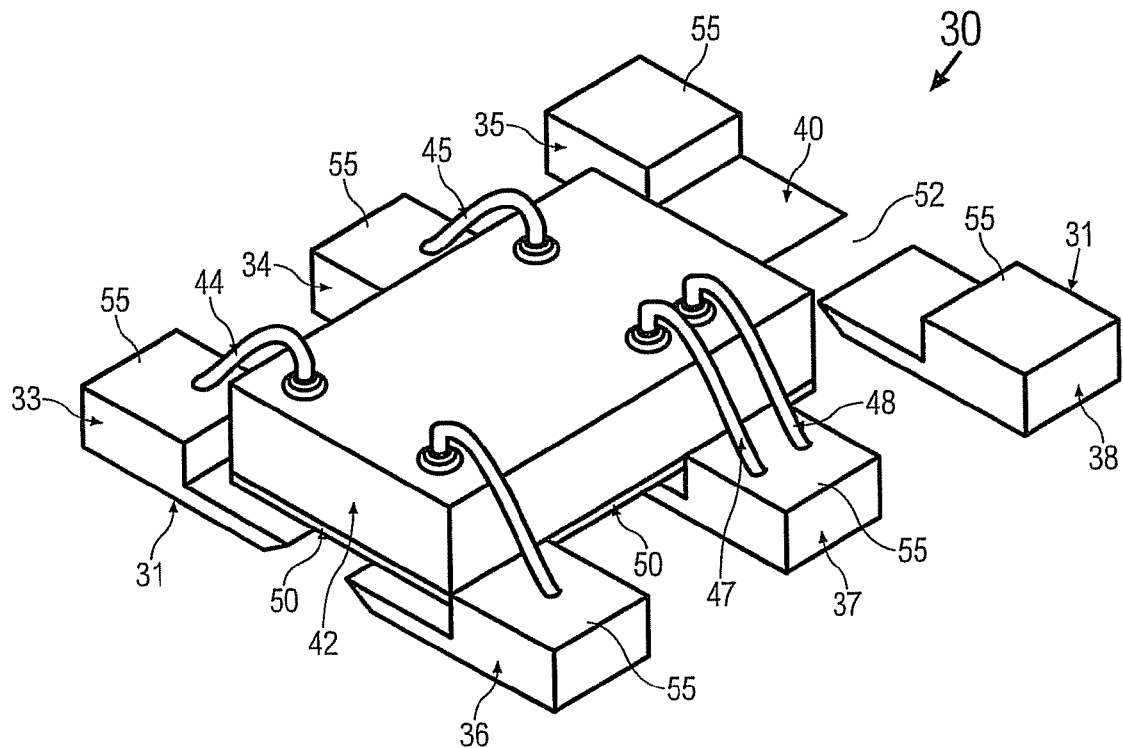
FIG. 7 illustrates an exposed perspective view of the COL package from a top angle.
Figure 8:
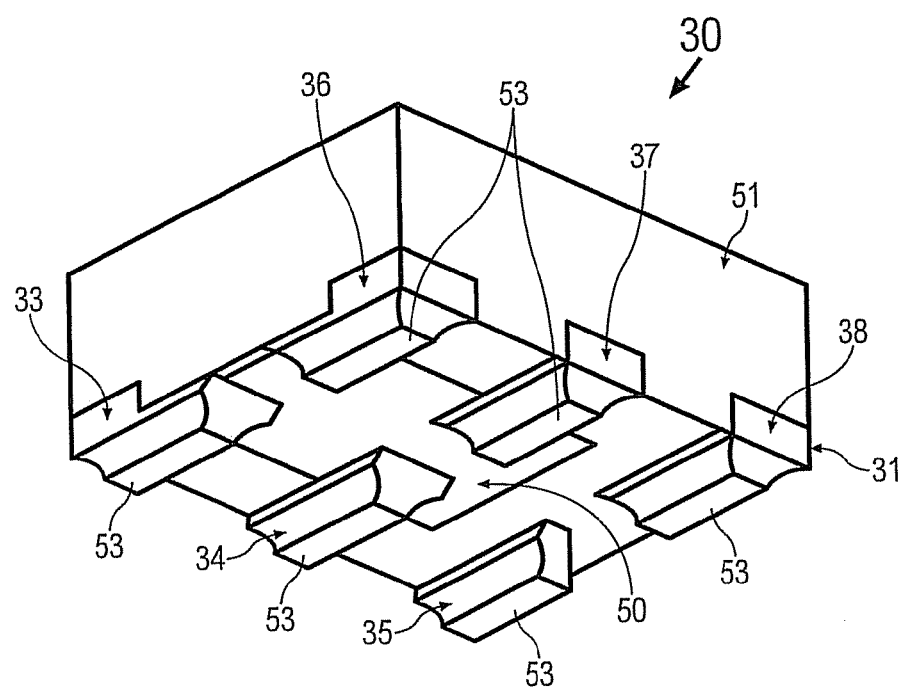
FIG. 8 illustrates a perspective view of the third COL package from a bottom angle.
Figure 9:
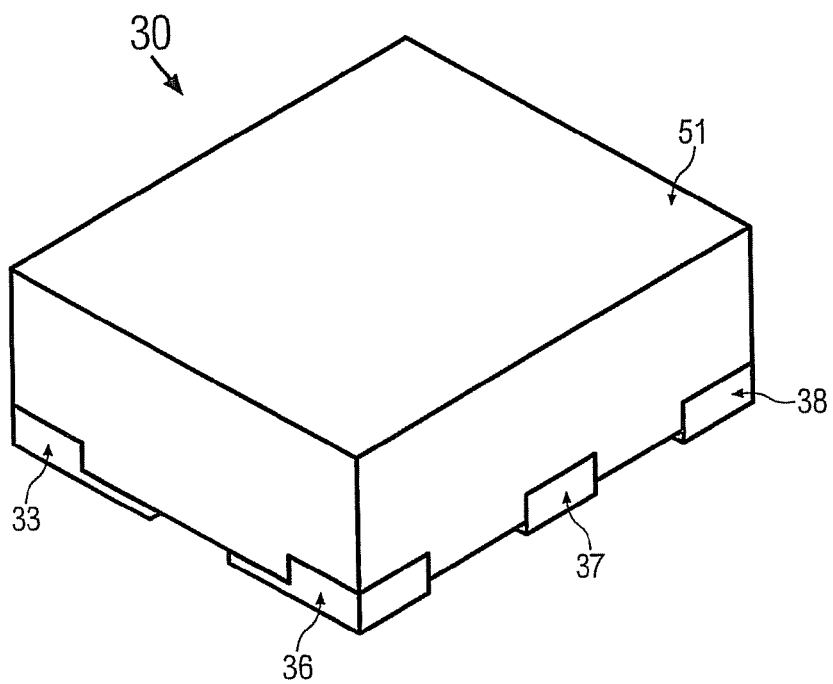
FIG. 9 illustrates a perspective view of the third COL package from a top angle.

FIGS. 6 to 9 illustrate different views of a third COL package 30. An overall view is depicted by a sectioned front view of FIG. 6. FIG. 7 illustrates an exposed perspective view from a top angle for a better view of internal parts of the third COL package 30. FIG. 8 illustrates a perspective view from a bottom angle whilst FIG. 9 depicts a perspective view from a top angle.

FIG. 5 illustrates a sectioned view of a second encapsulated COL package 20. The FIG. 5 includes parts that are similar to the parts of FIGS. 1 to 4. The similar parts have similar names. The description of the similar parts is hence incorporated by reference.

The second encapsulated COL package 20 includes a plurality of lead fingers 11 and a semiconductor chip 12, which are covered by a molding compound 21. The semiconductor chip 12 is placed on a recess 18 of the lead fingers 11.

The encapsulation compound 21 is intended to protect the semiconductor chip 12 from the external environment.

In a broad sense, the molding compound 21 is a form of an encapsulation compound. The encapsulation compound may include a soft gel.

A method of producing the second encapsulated COL package 20 is described below. The method includes providing a lead frame material sheet 14. The lead frame material sheet 14 includes a first surface 15' with a continuous surface area and a second surface 15".

After this, the continuous surface area of the first surface 15' is etched to form the recess 18. The semiconductor chip 12 is then placed in the recess 18 of the first surface 15'.

Later, the molding compound 21 is placed on the lead frame material sheet 14. The molding compound 21 covers the semiconductor chip 12 and a portion of the first surface 15'. The continuous surface area of the first surface 15' keeps the molding compound 21 from reaching the second surface 15".

The second surface 15" of lead frame material sheet 14 is afterwards etched to form individual lead fingers 11.

The process of producing the second encapsulated COL package 20 in the order illustrated above avoids mold bleed. Seepage or spread of the molding compound 21 from the first surface 15' onto the second surface 15" is known as mold bleed. In other methods of producing the COL package 20, the process of etching the lead frame material sheet 14 occurs before the process of covering the semiconductor chip 12 with the molding compound 21. The etched lead frame material sheet 14 has gaps through which the molding compound 21 can seep onto the second surface 15". The seepage of the molding compound 21 onto the second surface 15" is prevented from occurring in the above method as the gaps are not present during the process of covering the semiconductor chip 12.

The FIGS. 6 to 9 includes parts that are similar to the parts of FIGS. 1 to 5. The similar parts have similar names. The description of the similar parts is hence incorporated by reference.

The third COL package 30 includes a lead frame 31. The lead frame 31 includes a plurality of leads 33 and 36. Others leads 34, 35, 37 and 38 of the lead frame 31 are best seen in FIG. 7. The leads 34 to 38 have a recess 40 that is provided on a top of the leads 34 to 38.

A die 42 is positioned on the recess 40, as illustrated in FIGS. 6 and 7. A plurality of bond wires 44 to 48 are attached between the die 42 and the leads 33 to 38. A die bonding tape 50 is provided between the die 42 and the top of the leads 33, 34, 36 and 37. The die 42, the leads 33 to 38, and the bond wires 44 to 48 are covered with a molding compound 51.

The die 42 has an upper active surface on which a plurality of electrical circuits is formed. The electrical circuits are connected to the bond wires 44 to 48 by contact pads that are placed on the active surface. The electrical circuits and the contact pads are not illustrated in the FIGS. 6 to 9.

The leads 33 to 35 can form a first row whilst the leads 36 to 38 can form a second row, as illustrated in FIG. 7. The first row is separated from the second row by a gap 52. The leads 33 to 38 include similar profiles and similar height. Parts of the leads 33 to 38 protrude from the molding compound 51 in a downward direction, as seen in FIGS. 6 and 8.

A layer 53 of conductive material, NiAu (Nickel-Gold) is provided on bottom surfaces of the leads 33 to 38, as depicted in FIGS. 6 and 8. The conductive layer 53 is sufficiently large for electrical testing such that testing probes do not require high precision to contact the conductive layer 53 during the electrical testing. Contact areas 55 are provided on top surfaces of the leads 33 to 38. The contact areas 55 are connected to the die 42 by the bond wires 44 to 48.

As depicted in FIG. 7, the lead 33 is attached to the die 42 by the bond wire 44 whilst the lead 34 is connected to the die 42 by the bond wire 45. Similarly, the lead 36 is attached to the die 42 and by the bond wire 46. The lead 37 is connected to the die 42 by the bond wires 47 and 48. The bond wires 44, 45 and 46 include gold material whereas the bond wires 47 and 48 have aluminum material.

The die bonding tape 50 is exposed at the bottom of the third COL package 30, as illustrated in FIG. 8. The exposed die bonding tape 50 has a partial rectangular shape. The leads 33, 34, 36 and 37 cover parts of the die bonding tape 50.

Portions of the leads 33 to 38 protrude from the molding compound 51 in a download manner. The lead 33, 34, 35, 36, 37 or 38 is separate from its adjacent lead 33, 34, 35, 36, 37 or 38. The leads 33 to 38 have indentations 57 and 58, as depicted in FIGS. 6 and 8. The indentations 57 and 58 have a partial cylindrical form.

As seen in FIG. 9, the molding compound 51 has a substantially cubical shape. The molding compound 51 encapsulates the die 42, the lead frame 31, and the bond wires 44 to 48 such that these parts are not visible. The molding compound 51 also covers the leads 33 to 38 such that parts of leads 33 to 38 are not covered the molding compound 51.

The protrusions of the leads 33 to 38 allows for easy electrical contact with external terminals, such as contact areas of a printed circuit board. The material of conductive layer 53 provides good electrical contact between the external terminals and the leads 33 to 38.

The die bonding tape 50 has thermally conductive material for dissipating heat away from the operational die 42 via the leads 33, 34, 36, and 37.

In a broad sense, the leads 33 to 38 are a type lead fingers whilst the die 42 is a type of semiconductor chip. The molding compound is a form of encapsulation compound. The bond wires 44 to 48 are the form of wires. The die bonding tape 50 is the form of a layer of bonding material.

The lead frame material 31 can be in the form of a pre-plated frame (PPF) with the conductive layer 53. The conductive layer 53 can include other conductive material, such as nickel-palladium gold (NiPd Au). The bond wires 44 to 46 can have aluminum material instead of gold material whilst the bond wires 47 and 48 may include gold material instead of aluminum material. The bond wire 44 to 48 may have the same material instead of different materials. The bond wire 44 to 48 may be attached to the lead frame 31 or the die 42 by ball bonding or wedge bonding technique. The die bonding tape 50 can include a die bonding adhesive, such as epoxy glue.

The parts of third COL package 30 provide different functions. The lead frame 31 provides a supporting structure for the die 42, the die bonding tape 50, and the bond wires 44 to 48. The recess 40 is intended for receiving the die 42 and provides support to the die 42. The die 42 provides electronic functions of the third COL package 30, which include processing of analogue signals or digital signals.

The gold material of the bond wires 44 to 46 enables easy attachment of the bond wires 44 to 46 to the die 42. The aluminum material of the bond wire 47 and 48 allows the bond wire 47 and 48 to have a thick diameter for transport of high electrical current density without incurring high cost. The bond wires 44 to 48 provide electrical paths between the die 42 and an external substrate, such as printed circuit board (PCB), through the leads 33, 34, 36 and 37.

The leads 33 to 38 act as external electrical terminals for the third COL package 30. The bonding of the bond wire 47 and 48 to the same lead 37 allows greater amount of current to be transferred between the lead 37 and the die 42. The die bonding tape 50 electrically insulates the die 42 from the leads 33, 34, 36 and 37 and dissipates heat that is generated by the die 42.

The conductive layer 53 protects the lead frame 31 from oxidation. The conductive layer 53 also provides good electrical contact to an external substrate and good adhesion to the external substrate. In a case where solder is applied, the gold material of the conductive layer 53 diffuses into the solder during a re-flow process and aids in bonding the third COL package 30 onto the external substrate.

The molding compound 51 is intended for protecting internal part of the third COL package 30 from external environment, such as heat, electrical discharge, and mechanical shocks. The internal parts include the leads 33 to 38, the die 42, and the bonding wires 44 to 48 together with the die bonding tape 50. Moreover, the molding compound 51 secures the internal part of the third COL package 30 and keeps the internal parts from shifting.

Figure 10:
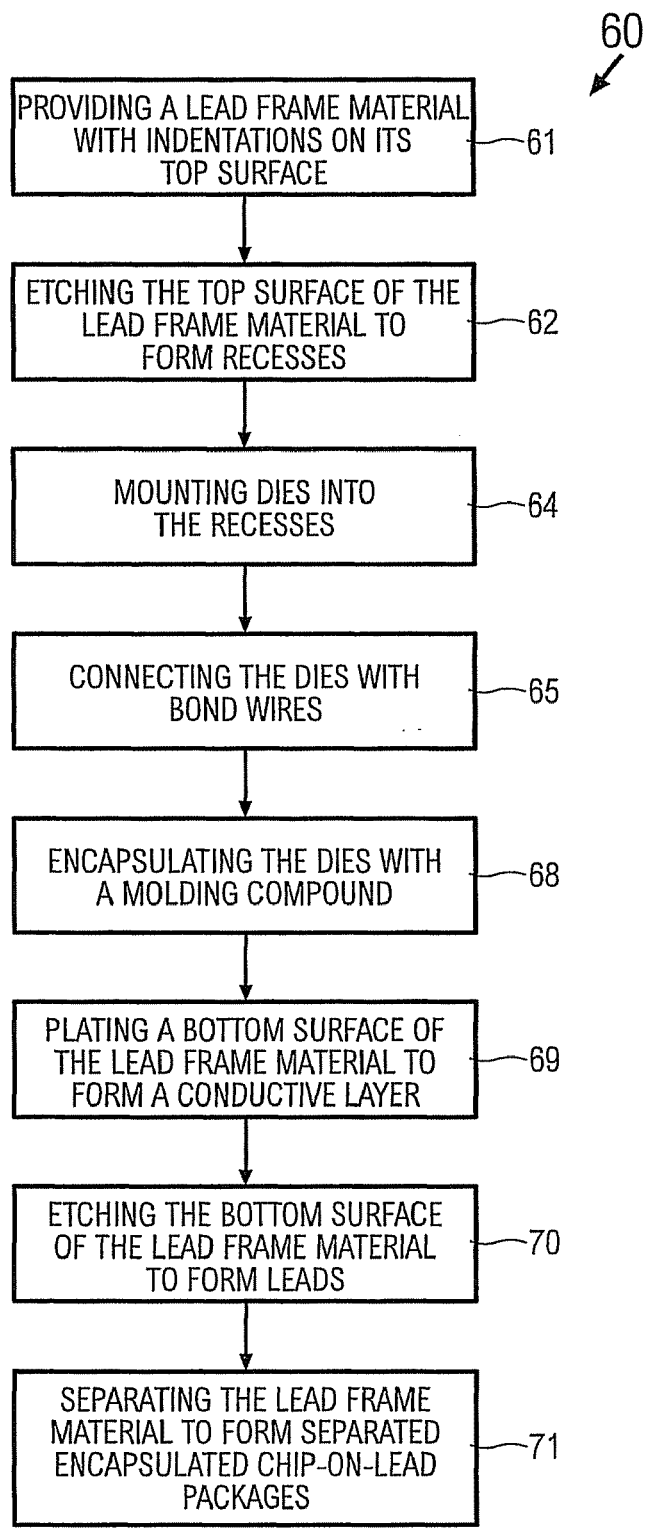
FIG. 10 illustrates a flow chart of manufacturing processes for making the third COL package of FIG. 8.

FIG. 10 illustrates a flow chart 60 of manufacturing processes 61 to 71 for making the third COL package 30 of FIGS. 6 to 9.

The flow chart 60 commences with the process 61 of providing a lead frame material with indentations on its top surface. The process 62 of etching the lead frame material for forming cubical recesses on the top surface is then provided. The process 64 of mounting dies into the recesses is placed after the process 62. The process 65 of connecting the dies with bond wires is positioned after the process 64.

The process 68 of encapsulating the dies with a molding compound follows the process 65. The process 69 of plating a conductive layer onto a bottom surface of the lead frame material is placed after the process 68. The process 70 of etching the bottom surface of the lead frame material to form leads is placed after the process 69. The process 71 of separating the lead frame material is provided after the process 70.

In a broad sense, the above-mentioned processes can be changed. For example, the process 62 of etching may include the process of providing the indentations on the lead frame.

A method of producing the third COL package 30 is illustrated in FIGS. 11 to 21.

Figure 11:
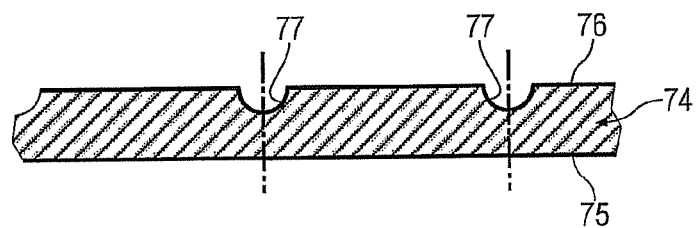
FIG. 11 illustrates a lead frame material with indentations on its top surface.

A lead frame material sheet 74 is provided, as illustrated in FIG. 11. The lead frame material sheet 74 includes a copper alloy sheet that has a uniform thickness. The lead frame material sheet 74 has a continuous bottom surface 75 and a continuous top surface 76 that is opposite the bottom surface 75. The continuous top surface 76 or the continuous bottom surface 65 has no through hole, gap, or opening in it.

After this, indentations 77 are formed on the top surface 76. The formation of the indentations 77 is by a chemical etching process. An acid resistive mask is firstly provided on top of the copper alloy sheet. The mask has openings that correspond to position of the indentations 77.

The mask is formed by placing a photo-resist layer on the top surface 76 of the lead frame material sheet 74. An ultra-violet (UV) light is later projected through a photo-mask onto the photo-resist layer for a predetermined period of time. The projection causes portions of the photoresist that are exposed to UV light to solidify. The un-solidified portions are later removed. The solidified portions form the mask. In other words, an image is transferred to the photo-resist layer.

The copper alloy sheet is then immersed into a tub of acid, such as ferric chloride acid ($FeCl_3$), for a predetermined period of time. The openings expose portions of the lead frame material sheet 74 to be removed by the acid. The removal forms the indentations 77 on the lead frame material sheet 74. Afterwards, the copper alloy sheet is removed from the tube of acid. The mask and any residual acid are later removed by an agent, such as acetone.

This process produces indentations 77 that are distributed in a grid formation with the indentations 77 being provided at joints of the grid formation. The indentation 77 has a particular depth and a partial cylindrical form. The indentations 77 are at a uniform distance away from the bottom surface 75. Geometrical centers of the indentations 77 are marked with centerlines in the FIG. 11.

The indentations 77 are used by later processes of the manufacturing process for positioning or aligning the lead frame material sheet 74.

Figure 12:
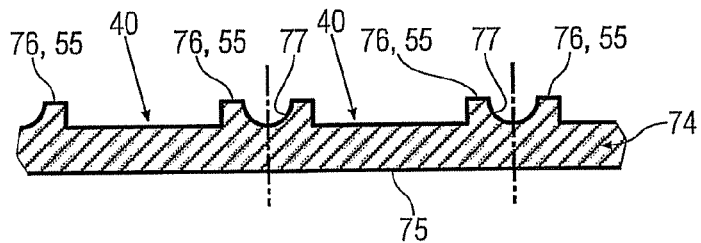
FIG. 12 illustrates the lead frame material of FIG. 12 having recesses on the top surface.

As depicted in FIG. 12, the top surface 76 of the lead frame material sheet 74 is then etched to form the recesses 40. This etching process to form the recesses 40 is similar to the above-mentioned etching process to form the indentations 77.

The etched top surface 76 is subjected to removal of parts of the lead frame material sheet 74. The un-etched top surface 76 forms the contact areas 55.

The die bonding tape 50 is provided on a wafer, which includes a plurality of dies 42. The wafer is then sawn to separate the die 42 from its adjacent die 42. The sawing also separates the die bonding tape 50 which is attached to the dies 42. The die bonding tape 50 is positioned on a bottom surface of the die 42.

Figure 13:
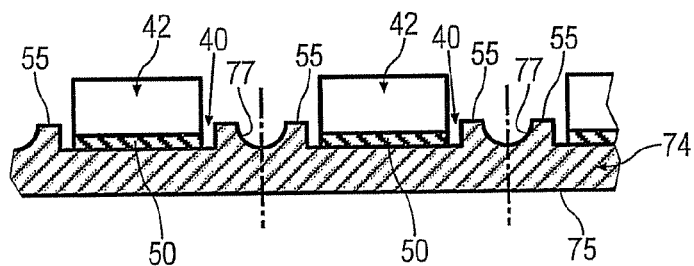
FIG. 13 illustrates dies being provided on the lead frame material of FIG. 13.

The dies 42 are later placed on the recesses 40, as depicted in FIG. 13. The placement is done using an accurate die placement machine. The die bonding tape 50 attaches the die 42 to the recesses 42 and keeps the die 42 from shifting.

Figure 14:
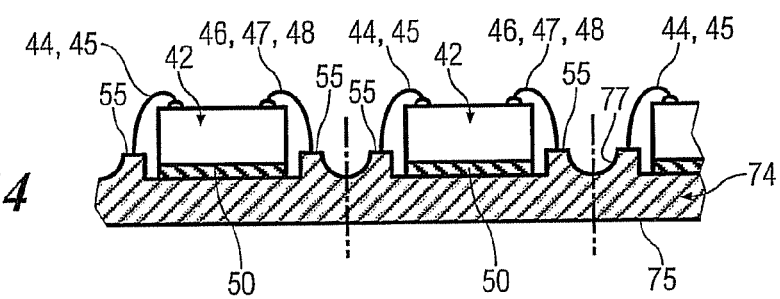
FIG. 14 illustrates a plurality of bond wires being connected to the dies of FIG. 14.

After this a plurality of bond wires 44 to 48 are attached between the dies 42 and the contact areas 55 using a wire bond machine. This is illustrated in FIG. 14.

Figure 15:
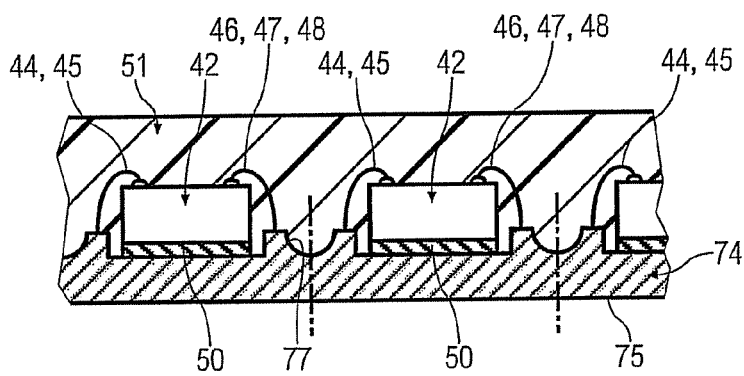
FIG. 15 illustrates the lead frame material of FIG. 15 being encapsulated with a molding compound.
Figure 16:
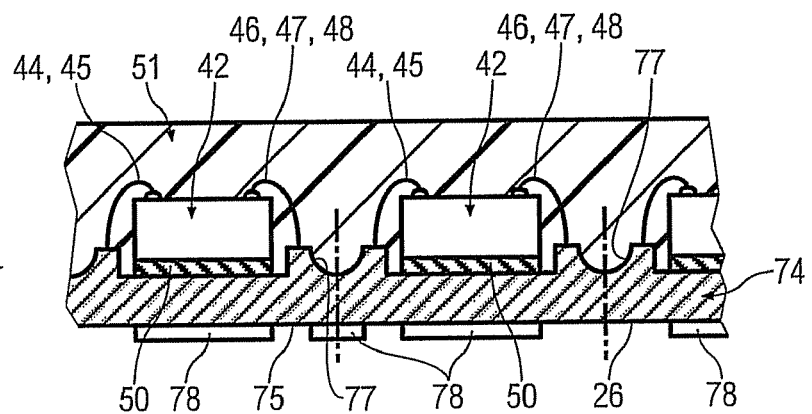
FIG. 16 illustrates a bottom surface of the lead frame material of FIG. 16 being provided with a mask.

The lead frame material sheet 74 is later covered by the molding compound 51, as illustrated in FIG. 15. The covering process includes placing the lead frame material sheet 74 inside a mold. When the mold is in a closed state, the molten molding compound 51 at a high temperature is injected into an upper portion of the mold. The molten molding compound 51 flows inside the mold and covers the dies 42 and the bonding wires 44 to 48. The molten molding compound 51 is prevented from reaching the bottom part of the lead frame material sheet 74 by the top surface 76 of the lead frame material sheet 74. There is no seepage of molding compound 51 onto the bottom surface 75 of the lead frame material sheet 74.

The molding compound 51 is afterward cooled. The cooling allows the molding compound to return to a solid state. The molding compound 51 includes a mold release agent for easy removal of the encapsulated lead frame material sheet 74 from the mold. The encapsulating molding compound 51 is then subjected to post mold curing to increase viscosity of the encapsulating molding compound 51.

As illustrated in FIG. 6, a mask 78 for forming the conductive layer 53 is then provided on the bottom surface 75 of the lead frame material sheet 74. The mask 78 has openings through which the bottom surface 75 of the lead frame material sheet 74 is exposed and is not covered.

Figure 17:
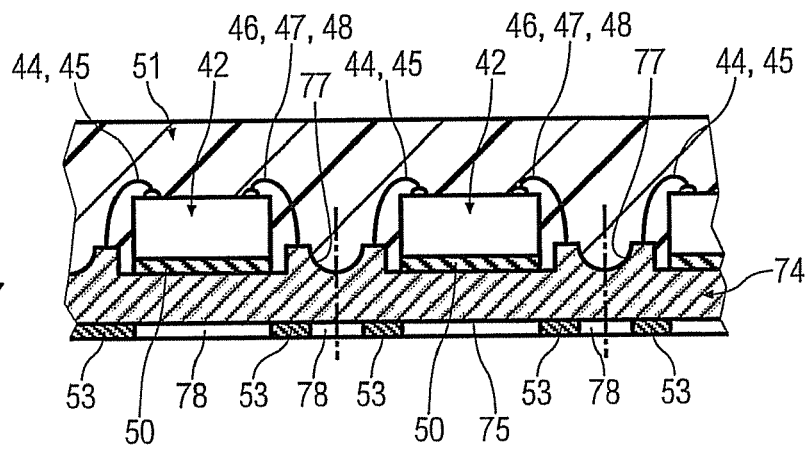
FIG. 17 illustrates a layer of conductive material being plated onto the bottom surface of the lead frame material of FIG. 18.
Figure 18:
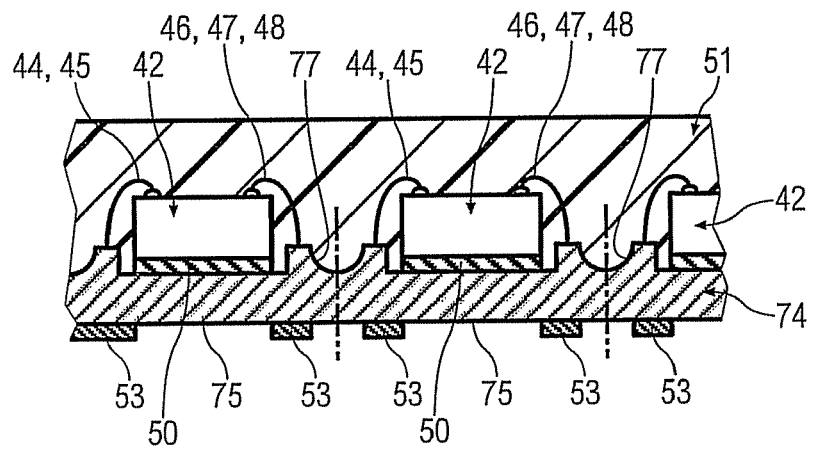
FIG. 18 illustrates the bottom surface of the lead frame material of FIG. 18 without the mask.

The conductive layer 42 of NiAu material is afterwards plated onto the bottom surface 75 of the lead frame material sheet 74. The conductive layer 42 is placed on the exposed parts of the bottom surface 75. This is illustrated in FIG. 17. The plating is provided by sequential immersion of the lead frame material sheet 74 through a series of wet chemical baths.

The mask 78 is afterward removed, as depicted in FIG. 8.

Figure 19:
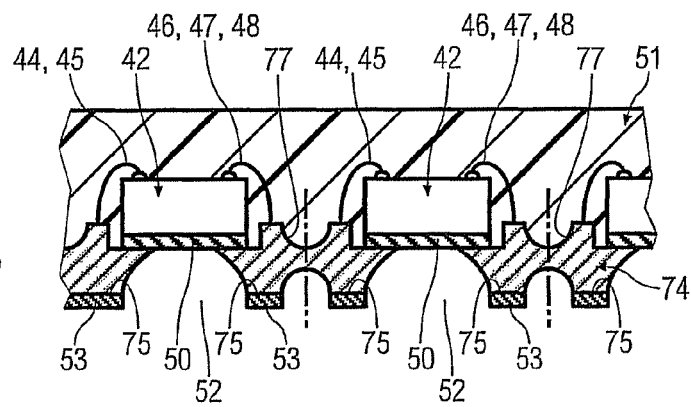
FIG. 19 illustrates the lead frame material of FIG. 19 with the bottom surface being etched.

The bottom surface 75 of the lead frame material sheet 74 is later etched to expose the die bonding tape 50, as illustrated in FIG. 19. The conductive layer 53 of NiAu material acts as an etch resistance mask for this etching process. The layer 53 of NiAu material has an etching resistance property. The gold material is resistance to etching by acid. The etching process produces gaps 52 on the bottom surface 75 of lead frame material sheet 74 and exposes parts of the bottom surface of the die bonding tape 50. The gaps 52 connect bottom surface 75 to the top surface 76.

Figure 20:
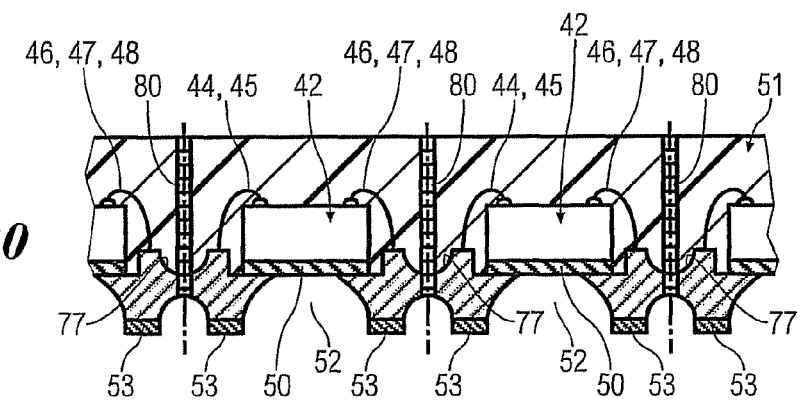
FIG. 20 illustrates the lead frame material of FIG. 21 being with separated.

The etched lead frame material sheet 74 are then separated to form separated COL packages 30, as depicted in FIG. 20. The separation is performed by sawing along saw streets 80. The saw streets 80 extend from top surface of the molding compound 51 to the indentations 77 and to the bottom surface 75 of the lead frame material sheet 74. The sawing separates the mold compound 51 and the etched lead frame material sheet 74 to form separated COL packages 30.

Figure 21:
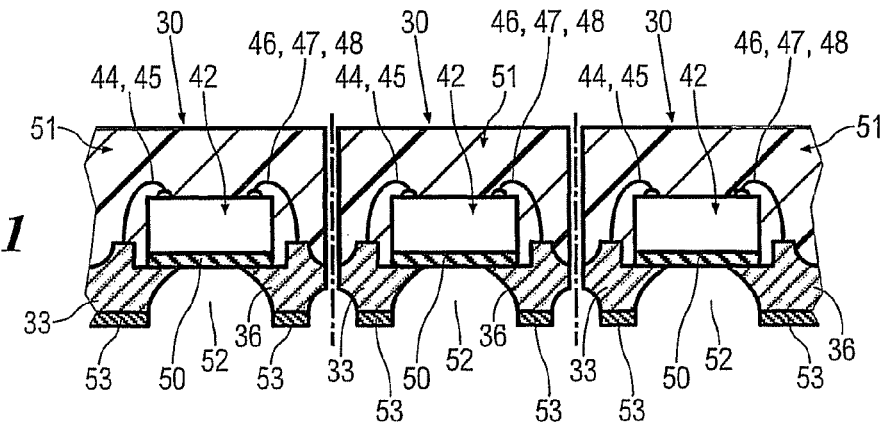
FIG. 21 illustrates the separated lead frame material.

The separated COL packages 30 are illustrated in FIG. 21. The third COL packages 30 may be subjected to further package and electrical testing in a later process to ensure the third COL package 30 meet package and device specification.

The above-mentioned method keeps the molding compound 51 at the top surface 76 of the lead frame 31 and advantageously prevents the molding compound 51 from reaching the bottom surface 75. Thus, mold bleed is avoided. Moreover, the method produces the recess 40 for securing the dies 42 and places the dies 42 at a lower height.

In a broad sense, many other etching techniques can be used to replace the above-mentioned etching processes. The indentations 77 are provided by a stamping machine instead of etching.

Although the above description contains much specificity, these should not be construed as limiting the scope of the embodiments but merely providing illustration of the foreseeable embodiments. Especially the above stated advantages of the embodiments should not be construed as limiting the scope of the embodiments but merely to explain possible achievements if the described embodiments are put into practice. Thus, the scope of the embodiments should be determined by the claims and their equivalents, rather than by the examples given.

What is claimed is:

1. A method of manufacturing a semiconductor device comprising:
   providing a lead frame material sheet;
   etching the lead frame material sheet to form a recess on a first surface of the lead frame material sheet;
   placing a semiconductor chip into the recess of the lead frame material sheet with a bonding material situated between the semiconductor chip and the lead frame material sheet;
   selectively etching a second surface of the lead frame material sheet opposite the first surface, such that the lead frame material under the semiconductor chip is separated to form individual lead fingers and parts of the bonding material are exposed and parts of the bonding material are covered by the lead frame material sheet; and
   cutting through the lead frame material to separate the semiconductor device from the leadframe material sheet such that an end of each of the individual lead fingers is exposed on a side face of the semiconductor device which is perpendicular to the first surface.

2. The method of claim 1, comprising wherein the recess is formed by selectively etching the first surface of the lead frame material sheet.

3. The method of claim 1, wherein the method further comprises attaching the bonding material onto the semiconductor chip before placing the semiconductor chip into the recess.

4. The method of claim 1, wherein the method further comprises attaching a plurality of wires between the semiconductor chip and the lead frame material sheet after placing the semiconductor chip into the recess.

5. The method of claim 1, wherein the method further comprises covering the semiconductor chip with a molding compound before selective etching the second surface.

6. The method of claim 1, comprising wherein the second surface is selectively etched until the lead frame material sheet is fragmented.

7. The method of claim 6, comprising fragmenting the lead frame material sheet to form electrical connection elements.

8. The method of claim 6, wherein the method further comprises plating portions of the fragmented lead frame material sheet.

9. The method of claim 1, comprising wherein the lead frame material sheet comprises a metal substrate.

10. A method of manufacturing an electronic device comprising:
    providing a carrier sheet;
    removing a first portion of the carrier sheet to form an indentation on a first surface of the carrier sheet;
    removing a second portion of the carrier sheet to form a recess on the first surface of the carrier sheet;
    placing an electronic component into the recess of the carrier sheet with a bonding material situated between the electronic component and the carrier sheet;
    selectively removing of at least a part of a second surface of the carrier sheet such that parts of the bonding material are exposed and parts of the bonding material are covered by the carrier sheet, the second surface being opposite to the first surface.

11. The method of claim 10, comprising wherein the carrier sheet is in the form of a lead frame material sheet with a continuous surface area.

12. The method of claim 10, comprising wherein the electronic component is in the form of a semiconductor chip.

13. The method of claim 10, wherein the method further comprises covering the electronic component with an encapsulation compound before selectively removing the second surface.

14. The method of claim 5, wherein cutting through the lead frame material includes cutting through the molding compound, and wherein the side face of the semiconductor device which is perpendicular to the first surface includes the lead frame material and the molding compound.

15. The method of claim 13, further comprising selectively removing a portion of the second surface of the carrier sheet to form an indentation directly opposite the indentation on the first surface of the carrier sheet.

16. The method of claim 13, further comprising cutting through the encapsulation compound and the carrier sheet proximate the indentations in the first and second surfaces of the carrier sheet to form a side surface perpendicular to the first and second surfaces, wherein a portion of the carrier sheet is exposed in the side surface.

\* \* \* \* \*